(12) United States Patent
Harris et al.

(10) Patent No.: US 6,169,422 B1
(45) Date of Patent: Jan. 2, 2001

(54) APPARATUS AND METHODS FOR HIGH THROUGHPUT SELF-TIMED DOMINO CIRCUITS

(75) Inventors: David L. Harris, Menlo Park; William S. Coates, Redwood City, both of CA (US)

(73) Assignee: Sun Microsystems, Inc., Palo Alto, CA (US)

( * ) Notice: Under 35 U.S.C. 154(b), the term of this patent shall be extended for 0 days.

(21) Appl. No.: 09/119,032

(22) Filed: Jul. 20, 1998

(51) Int. Cl.$^7$ ............................................. H03K 19/096
(52) U.S. Cl. ............................. 326/98; 326/119; 326/121
(58) Field of Search .................... 326/93, 95, 98, 326/112, 119, 121

(56) References Cited

U.S. PATENT DOCUMENTS

| | | | |
|---|---|---|---|
| 4,644,185 | * 2/1987 | Todd | 326/93 |
| 4,751,407 | 6/1998 | Powell . | |
| 5,121,003 | 6/1992 | Williams . | |
| 5,329,176 | * 7/1994 | Miller, Jr. et al. | 326/93 |
| 5,434,520 | * 7/1995 | Yetter et al. | 326/93 |
| 5,513,132 | * 4/1996 | Williams | 364/715.01 |
| 5,565,798 | * 10/1996 | Durham et al. | 326/93 |
| 5,671,151 | 9/1997 | Williams . | |

OTHER PUBLICATIONS

Sutherland, Ivan E., *Micropipelines,* Communications of the ACM, vol. 32, No. 6, Jun. 1989, pp. 729–738.

Williams, Ted. E., Self–Timed Rings and Their Application to Division, Technical Report No. CSL–TR–91–482, May 1991.

Harris, David, High Speed CMOS VLSI Design, Lecture 7: *Dynamic Circuits,* Nov. 4, 1997.

Harris, David, et al., Skew–Tolerant Domino Circuits, IEEE Journal of Solid–State Circuits, vol. 32, No. 11, Nov. 1997.

Furber, S.B., The Return of Asynchronous Logic, http://www.cs.man.ac.uk/amulet/asyn/asyncdesc.html#Ref2, printed Jun. 19, 1998, 6 pages.

Harris David, et al., SP–25.7: Skew–Tolerant Domino Circuits, Stanford University, Stanford CA, 22 slides, undated.

* cited by examiner

Primary Examiner—Michael Tokar
Assistant Examiner—Don Phu Le
(74) Attorney, Agent, or Firm—Finnegan, Henderson, Farabow, Garrett & Dunner, L.L.P.

(57) ABSTRACT

Asynchronous circuitry provides a domino circuit having short cycle times and zero overhead latency. The control circuit of a datapath circuit may utilize a completion signal from the datapath circuit to develop a request signal to the datapath circuit. The request signal may also be based on a request signal from a previous stage. Using the completion signal of a stage to develop the request signal for the same stage allows the circuitry to reduce the impact of constraints that are required for the asynchronous circuitry to operate. Similarly, using the request signal from a previous stage of the asynchronous circuitry to develop the request signal for a present stage also allows the circuitry to reduce the impact of constraints required to implement the asynchronous circuitry. These techniques allow the achievement of fast cycle times while maintaining zero overhead.

36 Claims, 5 Drawing Sheets

APPARATUS AND METHODS FOR HIGH THROUGHPUT SELF-TIMED DOMINO CIRCUITS

I. BACKGROUND OF THE INVENTION

A. Field of the Invention

The present invention relates to the field of asynchronous circuits. More particularly, apparatus and methods consistent with the present invention relate to logic circuits designed for high-speed asynchronous operation.

B. Description of the Prior Art

Advances in semiconductor fabrication technology allow increasing numbers of logic gates operating at increasing speeds. Synchronous design methodologies require a global clock signal keeping all gates operating in lock-step, which is becoming a greater challenge at such high speeds. Asynchronous design methodologies use local control to determine when a gate may operate, thereby eliminating the global clock distribution problem and potentially offering improved speed, lower power, reduced electromagnetic interference, and a host of other benefits.

There are two classes of asynchronous circuits: "self-timed" and "timed." Self-timed circuits, also referred to as delay-insensitive circuits, use a handshake between data and control circuits to guarantee that the control does not request an operation until the data is ready. Timed circuits attempt to match the delays of control and data circuits so that the control does not activate until the data is ready. Self-timed circuits are therefore more robust because they do not depend on accurate matching of delays.

In order to use self-timing, data signals must indicate not only a value, but also validity so that the control can check for data validity before proceeding. This can be done by encoding a data bit on two signals rather than one: X_H and X_L. This is called dual-rail signaling. When both signals are low, the data is invalid. When X_H is high, the data bit is a valid high level. When X_L is high, the data bit is a valid low level. X_H and X_L are never simultaneously high.

A popular way of building such data circuits is with dual-rail domino logic. Dual-rail domino gates, also known as dynamic differential cascode voltage switch (DCVS) gates or simply domino gates, accept a control signal and dual-rail inputs. They compute a function of the inputs and produce one or more dual-rail outputs. When the control signal is low, the domino gate is precharged such that both outputs are low. When the control signal is high, the domino gate evaluates, causing one of the two output rails to rise. Such domino gates evaluate quickly, allowing low latency computation.

A variety of approaches exist for building self-timed circuits with dual-rail domino gates. The approaches involve control circuits which apply control signals to the dual-rail domino gates so that the gates evaluate and precharge at the correct times. See, for example, Williams, T. E., "Self-Timed Rings and Their Application to Division," Computer Systems Laboratory, Departments of Electrical Engineering and Computer Science, Stanford University, Technical Report No. CSL-TR-91-482, May 1991. Using certain control schemes, Williams achieves zero-overhead latency, meaning that the delay from the input of a path to the output consists only of the delays of each gate in the path. Computation does not have to wait for control signals or latch delays.

Unfortunately, these control schemes have poor throughput, or cycle time, compared to aggressive synchronous designs. This is caused by the control schemes which spend excessive time handshaking with data to guarantee the data is ready. Therefore, existing self-timed domino circuits are too slow to be generally competitive with synchronous systems.

FIG. 1 shows a circuit schematic of a conventional dual-rail domino logic gate with completion detection suitable for use in a self-timed system. The particular gate in the illustration computes an AND/NAND function on inputs A and B. The gate accepts a request signal R and dual-rail inputs A_H, A_L, B_H, and B_L. It produces dual-rail outputs OUT_H and OUT_L, which are true and complementary versions of the function A AND B, along with a done signal $\overline{D}$ indicating completion of processing by the circuit, and thus validity of the output data. In this context, the true version means A AND B, while the complementary version means $\overline{\text{A AND B}}$. Request R is low during the precharge phase, at which time the gate precharges, pulling both outputs low and setting $\overline{D}$ high to indicate that the output is invalid. Request R is high during the evaluation phase, and if suitable inputs are high then either OUT_H or OUT_L will evaluate high, and $\overline{D}$ will fall to indicate the output is valid.

The gate comprises series n-channel field effect transistors (NFETs) 101–102 coupled between nodes 120 and 122 and parallel NFETs 103–104 coupled between nodes 121 and 122. Precharge p-channel field effect transistors (PPETs) 105 and 106 pull nodes 120 and 121, respectively, to a high level when request R is low. Series evaluation NFET 107 allows node 122 and hence either node 120 or 121 to pull low only when request R is high. Output inverter 108 is coupled between node 120 and output OUT_H, while output inverter 109 is coupled between node 121 and output OUT_L. NOR gate 110 coupled between the output nodes OUT_H and OUT_L and the active low done output $\overline{D}$ senses completion.

FIG. 2 is a block diagram of a self-timed domino system showing the interaction of control 210 and data circuits in the datapath 212. Datapath 212 comprises multiple stages, each stage comprising one or more domino gates sharing the same request signal R. The done signal $D_i$ from stage i, is computed from the done signals of each gate in the stage to indicate that the entire stage is done. The done signals from each stage of datapath 212 are communicated to control circuits (not shown) in control 210, which generate appropriate request signals as inputs to datapath 212. Control 210 comprises generalized control elements (C-elements) (not shown) corresponding to each stage of datapath 212. There are many conventional control schemes. Two schemes, proposed by Williams, PC0 and PS0, and the cycle time of each, will be discussed.

FIG. 3 shows a C-element control circuit for a conventional PC0 self-timed domino control scheme. The C-element may be used to implement control 210 of FIG. 2, and is responsible for computing request signal R for a particular stage of datapath 212. The circuit shown in FIG. 3 computes request signal $R_i$ for datapath stage i. It comprises a generalized C-element, including NFETs 301 and 302 coupled between node 305 and ground and PFETS 303 and 304 coupled between node 305 and power. The output inverter 306 is coupled between nodes 305 and the output $R_i$. Input inverter 307 is coupled from the done signal $\overline{D}_{i-1}$ of the previous stage to transistors 302 and 303. Done signal $\overline{D}_{i+1}$ of the next stage is coupled to transistors 301 and 304. These connections allow stage i to evaluate when stage i+1 is done precharging, and when stage i−1 is done evaluating. Stage i may precharge when stage i+1 is done evaluating and stage i−1 is done precharging.

FIG. 4 is a portion of the flat dependency graph for the PC0 self-timed domino control scheme of FIG. 3, used to compute the cycle time of the scheme. The nodes of the graph represent the delays of particular transitions, where R is the delay of the generalized C-element computing a request, F is the delay of a stage, or functional block, in the datapath, and D is the delay of completion detection. When an up-arrow or down arrow follows the letter, the delay refers specifically to the delay of the rising or falling transition. For convenience, we refer to the rising delay of F as the evaluation time, E, and the falling delay of F as the precharge time, P. Directed edges between nodes represent constraints enforced on the stage.

Edge 401 indicates that a stage must have a high request before it can evaluate. Edge 402 indicates that a stage must complete evaluation before it can signal done. Edge 403 indicates that a stage must have a low request before it can precharge. Edge 404 indicates that a stage must complete precharge before it can release the done signal. Edge 405 indicates that a stage must complete evaluation before the next stage can complete evaluation. Edge 406 indicates that a stage must signal done before the next stage can request evaluation. Edge 407 indicates that a stage must release its done signal before the next stage can request precharge. Edge 408 indicates that a stage must signal done before the previous stage can request precharge. Edge 409 indicates that a stage must release its done signal before the previous stage can request evaluation. Edges 401–405 are inherent to the nature of the stage. Edges 406–409 are enforced by the control circuit of FIG. 3.

The latency of a stage is the delay from when a stage finishes evaluating until the next stage finishes evaluating. If all stages are identical, the latency is E+R+D. Since the delay of useful computation is only E, the extra latency R and D is considered overhead and is undesirable. The cycle time of a stage, also known as local cycle time, is the delay of the longest simple cycle passing through the stage. If all stages are identical, the local cycle time of each stage can be shown to be E+P+2 max (E, P)+4R+4D. This is slower than might be desired for an aggressive system.

FIG. 5 is a circuit schematic of a conventional PS0 self-timed domino control scheme. In this scheme, the generalized C-element has zero transistors; instead, the done signal $\overline{D}_{i+1}$ of the next stage, is directly coupled to the current stage request signal $R_i$. Therefore, stage i is allowed to evaluate when stage i+1 is done precharging, and stage i is allowed to precharge when stage i+1 is done evaluating. A timing assumption is also required for correct operation, namely that evaluation time E is greater than precharge time P.

FIG. 6 is a portion of the flat dependency graph for the PS0 self-timed domino control scheme of FIG. 5. It is very similar to FIG. 4, but is missing two edges that can be omitted because of the timing assumption. Edge 601 indicates that a stage must have a high request before it can evaluate. Edge 602 indicates that a stage must complete evaluation before it can signal done. Edge 603 indicates that a stage must have a low request before it can precharge. Edge 604 indicates that a stage must complete precharge before it can release the done signal. Edge 605 indicates that a stage must complete evaluation before the next stage can complete evaluation. Edge 608 indicates that a stage must signal done before the previous stage can request precharge. Edge 609 indicates that a stage must release its done signal before the previous stage can request evaluation. Edges 601–605 are inherent to the nature of the stage. Edges 608–609 are enforced by the control circuit of FIG. 5. If all stages are identical, the latency is just E, so PS0 can achieve zero overhead operation. Unfortunately, the local cycle time of each stage can be shown to be 3E+P+2C+2D, which is still slower than might be desired. Note that E>P to satisfy the timing assumption. This may force longer evaluation times than a designer might otherwise have selected. There is, therefore, a need for a faster asynchronous circuit that provides zero overhead and faster cycle times than conventional asynchronous circuits like PC0 or PS0.

II. SUMMARY OF THE INVENTION

Apparatus and methods consistent with the present invention provide a self-timed domino circuit that achieves faster cycle times than conventional domino circuits. The apparatus and methods may also be applied to zero overhead domino circuits. By using a completion signal from the current stage and a request signal from the previous stage to develop the request signal for the current stage, cycle time limiting constraints can be relaxed. The apparatus and methods overcome the problems of conventional self-timed asynchronous circuits described above. Additional advantages of the invention are apparent from the description which follows, and may be learned by practice of the invention. It is to be understood that both the foregoing general description and the following detailed description are exemplary and explanatory only and are not restrictive of the invention, as claimed.

III. BRIEF DESCRIPTION OF THE DRAWINGS

The accompanying drawings, which are incorporated in and constitute a part of this specification, illustrate an embodiment of the invention and, together with the description, serve to explain the advantages and principles of the invention. The accompanying drawings, however, should not be taken to limit the invention to the specific embodiments shown, but rather are for explanation and understanding only. In the drawings, FIG. 1 is a circuit schematic of a conventional dual-rail domino logic gate with completion detection;

IV. DETAILED DESCRIPTION

Apparatus and methods consistent with the present invention provide asynchronous circuits. More particularly, apparatus and methods consistent with the present invention provide a self-timed domino circuit having zero overhead latency and better cycle time than conventional circuits. The better cycle time is achieved by identifying the essential dependencies in self-timed domino circuits and using a control scheme which enforces the essential dependencies while introducing few other nonessential dependencies which might limit cycle time.

Figure 1:
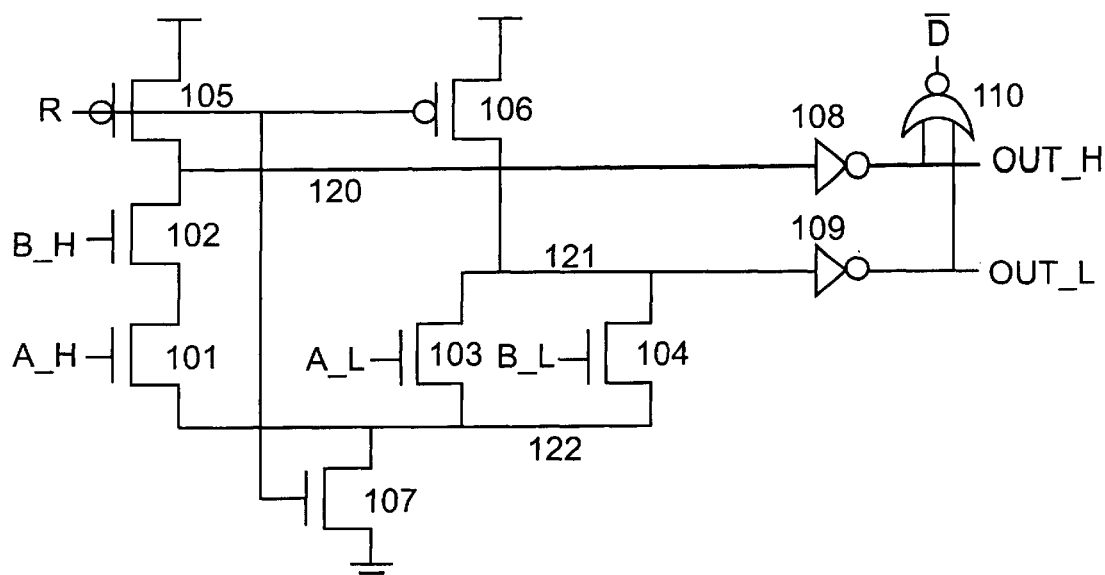
Figure 2:
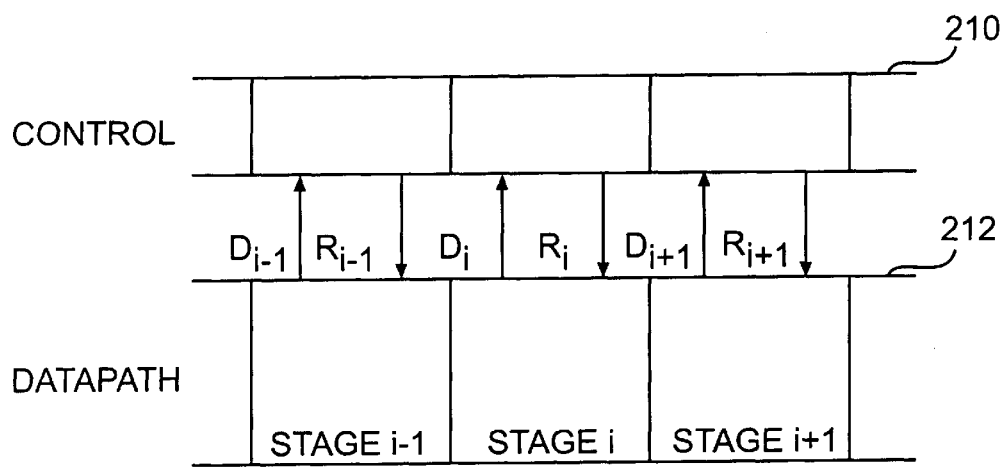
FIG. 2 is a block diagram showing the interaction of control and data circuits in self-timed systems.
Figure 3:
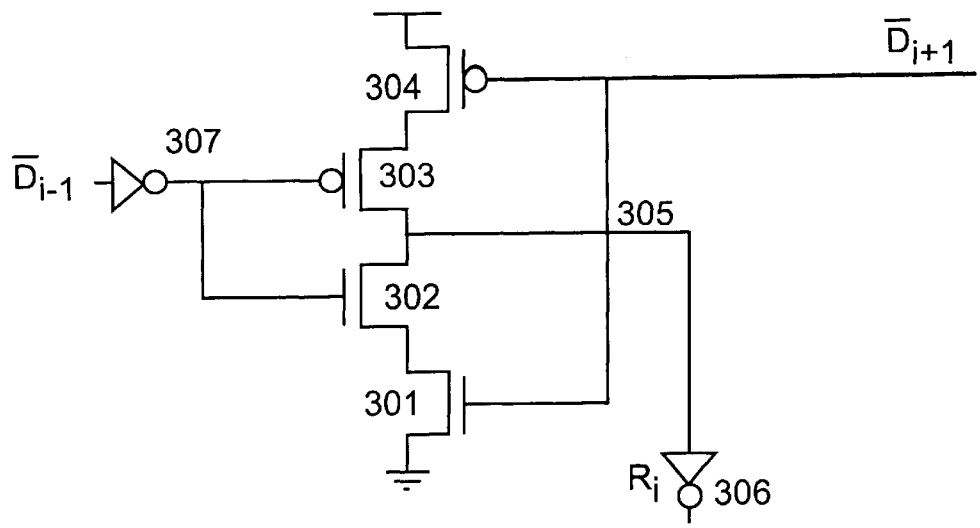
FIG. 3 is a circuit schematic of a conventional PC0 self-timed domino control scheme.
Figure 4:
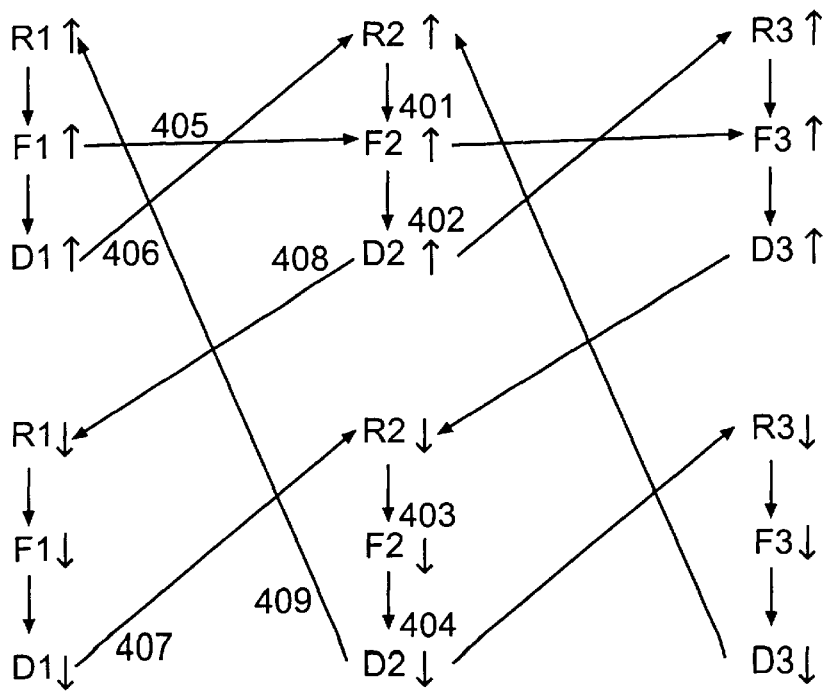
FIG. 4 is a portion of the flat dependency graph for the PC0 self-timed domino control scheme of FIG. 3.
Figure 5:
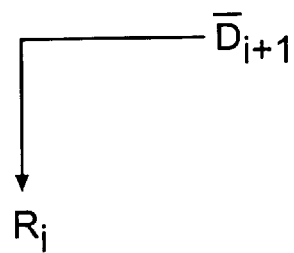
FIG. 5 is a circuit schematic of a conventional PS0 self-timed domino control scheme.
Figure 6:
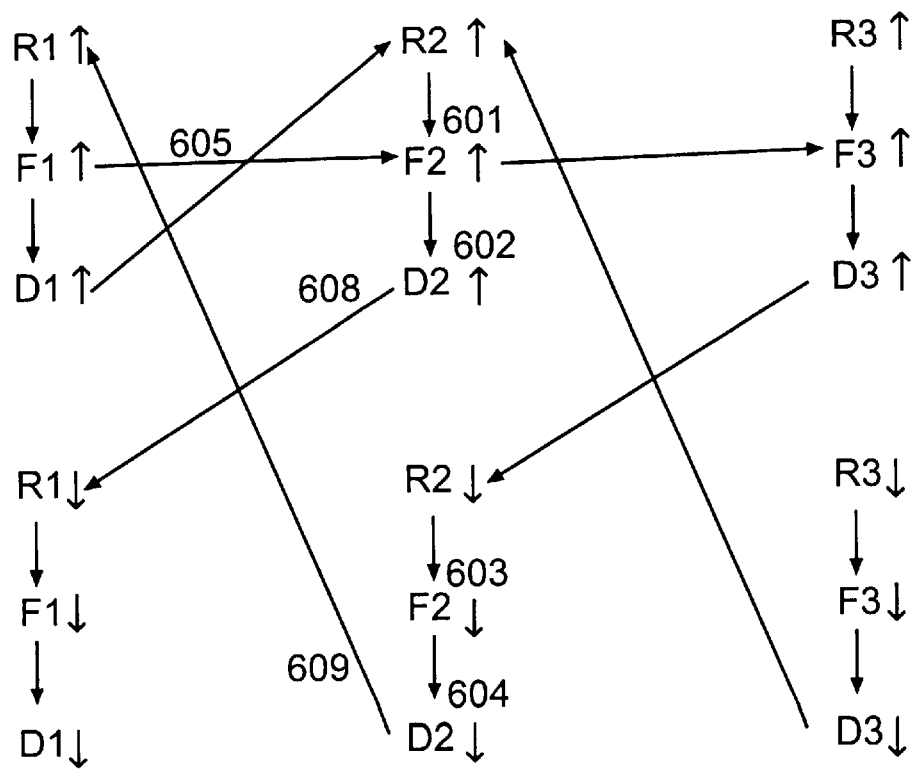
FIG. 6 is a portion of the flat dependency graph for the PS0 self-timed domino control scheme of FIG. 5.
Figure 7:
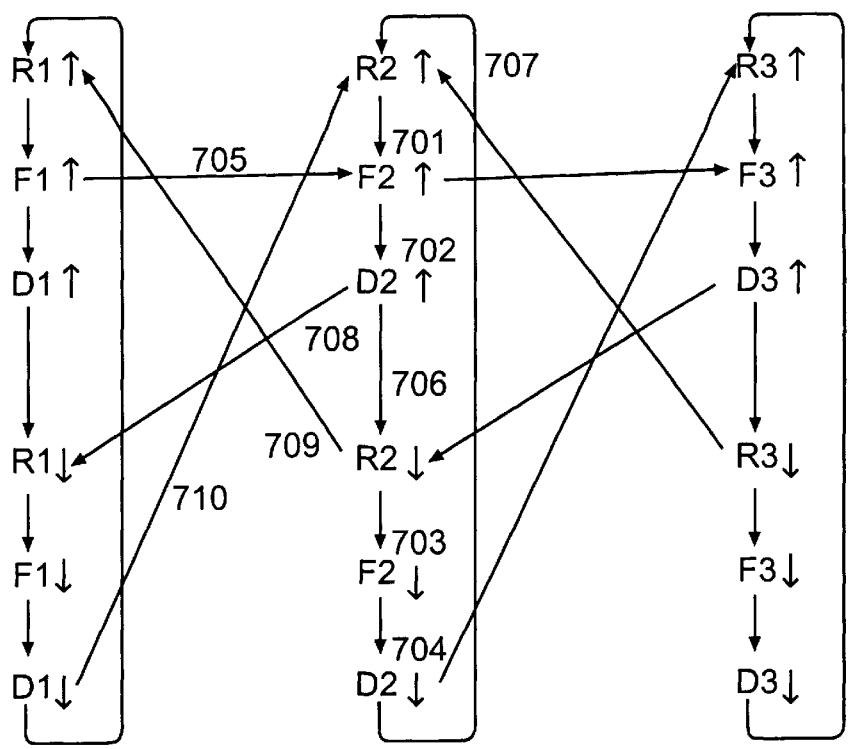
FIG. 7 shows the essential constraints of self-timed domino circuits.

Some of the constraints enforced by PC0 and PS0 are not essential for correct operation of the datapath. Cycle times can be improved by identifying the essential constraints and building a control circuit which enforces these essential constraints while introducing few others. FIG. 7 shows the essential constraints for self-timed domino circuits. Edges 701–704, 706 and 707 indicate that each stage must cycle through the request evaluate, evaluate, done, request precharge, precharge, release done operations in order. Edge 705 indicates that a stage must complete evaluation before the next stage may complete evaluation. Edge 708 indicates that a stage must signal done before the previous stage can request precharge so that the data from the previous stage is not lost before it is consumed. Edge 709 indicates that a stage must begin precharge before the previous stage may request evaluation so that data from the previous stage does not contaminate the result of the current stage. This is less restrictive than constraints in the PC0 and PS0 schemes which require that a stage complete precharge and release done before the previous stage may request evaluation. Edge 710 requires that a stage complete precharge before the next stage begins evaluation so old data in the current stage does not contaminate the next stage.

Figure 8:
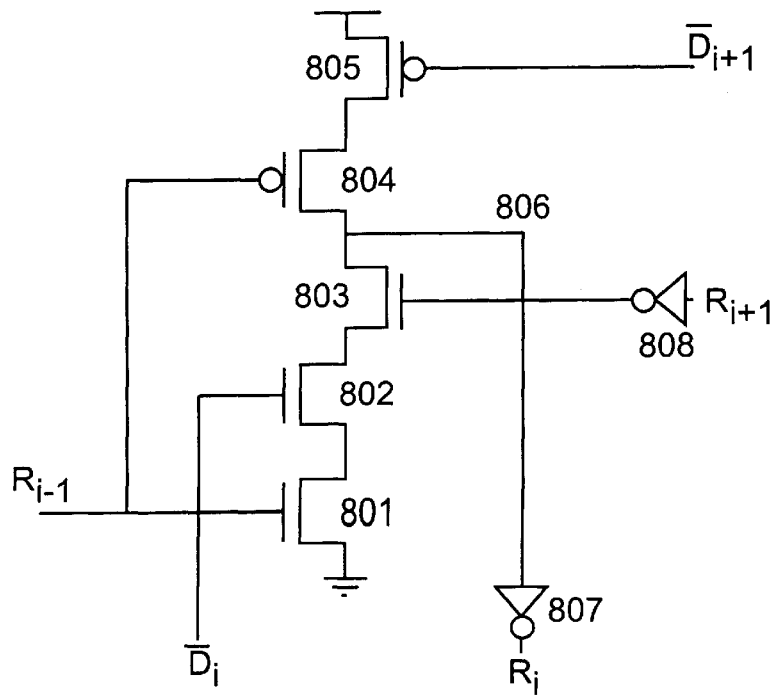
FIG. 8 is a circuit schematic of a preferred embodiment of the control circuit for the present invention.

FIG. 8 shows a circuit schematic of a preferred embodiment of the control circuit consistent with the principles of the present invention, which enforces the constraints of FIG. 7. The control circuit comprises of a generalized C-element with NFETs 801–803 in series between node 806 and ground and PFETs 804–805 in series between node 806 and power. The output inverter 807 is connected between node 806 and the request output $R_i$. Inverter 808 is connected between the request from the subsequent stage, $R_{i+1}$, and transistor 803. Many similar embodiments can achieve the same results, and yet be produced by permuting the order of the transistors in the generalized C-element. For example, the PFETs could be interchanged.

In another embodiment, output inverter 807 is eliminated by using a complimentary version of the generalized C element shown in FIG. 8, and a wire is used for outputting the current stage request signal. Thus, the same functionality is achieved.

The constraints of edges 701–705 are automatically enforced by the stage operation. Edge 707 is enforced by transistor 802. Edge 708 is enforced by transistor 805. Edge 709 is enforced by transistor 803. Edge 710 would require remembering that a stage has completed precharge even after the stage reenters evaluation. It is more convenient to simplify the constraint to require that the previous stage request evaluation before the current stage can request evaluation; this constraint is enforced by transistor 801. Edge 706 is not directly enforced, but rather is guaranteed by the operation of transistors 804 and 805 as discussed in the next paragraph.

Figure 9:
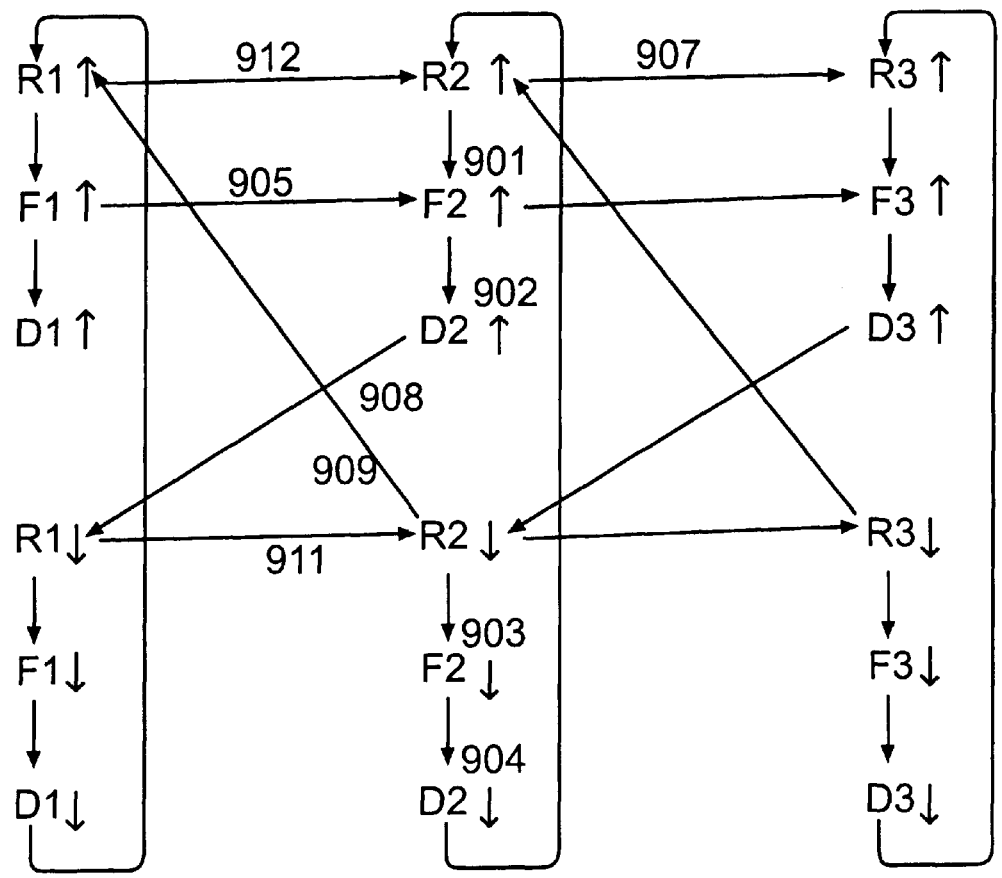
FIG. 9 is a portion of the flat dependency graph for the present invention of FIG. 8.

FIG. 9 is a portion of the flat dependency graph corresponding to the operation of the circuit shown in FIG. 8. Edges 901–905 correspond to edges 701–705 of the essential constraint graph. Edges 907–909 also correspond to edges 707–709. Edge 710 is replaced by edge 912, which is more conservative. Edge 706 is enforced by the combination of edges 908 and 911. From the dependency graph, we see that the latency is just E, again allowing zero overhead operation. The local cycle time is $2E+\max\{E, P+D\}+2R+D$ which is substantially better than PS0 or PC0 since circuits are designed for lowest latency by reducing E at the expense of P. The features that achieve this improved cycle time are the use of request signals from the previous stage and done signals from the current stage.

Conclusion

It will be apparent to those skilled in the art that various modifications and variations can be made in the apparatus and methods consistent with the principles of the present invention without departing from the scope or spirit of the invention. Although several embodiments have been described above, other variations are possible within the spirit and scope consistent with the principles of the present invention.

Using a completion signal from the current stage and a request signal from the previous stage to develop the request signal for the current stage, cycle time limiting constraints can be relaxed. The two types of signals used in developing the request signal, namely using a completion signal from the current stage or using a request signal from the previous stage, may be used either separately or together in designing asynchronous circuitry. Although using the two types of signals together provides particular advantages which allow relaxation of constraints on cycle time, each has advantages independent of the other, and therefore may be used independently.

Although the invention has been illustrated using CMOS logic, the principles may be applied to other logic families. For example, the principles of the invention may be used in gallium arsenide or any other logic family which supports precharged logic.

Moreover, dual-rail domino gates can be generalized to N-rail 1-hot domino circuits, and may be implemented in either an active high or active low encoding. Therefore, the principles discussed herein with respect to dual-rail domino gates apply to any other output encoding which allows completion detection.

The invention may be implemented in any form having characteristics of asynchronous circuitry. For example, the invention may be implemented in software, discrete circuitry, hardware, or a combination of these forms. If the invention is embodied in whole or in part in software, it may be stored in the form of instructions on a computer readable and usable medium.

Other embodiments of the invention will be apparent to those skilled in the art from consideration of the specification and practice of the disclosed embodiments. The specification and examples are exemplary only, and the true scope and spirit of the invention is defined by the following claims and their equivalents.

We claim:

1. Apparatus for implementing asynchronous circuitry, comprising:
   a current stage datapath element configured to respond to a first request signal and develop a first completion signal upon completion of processing at least one signal; and
   a current stage control element configured to develop the first request signal based on the first completion signal, wherein the current stage datapath element and the current stage control element are in the same stage.

2. The apparatus according to claim 1, wherein the current stage control element comprises:
   a first component configured to receive the first completion signal; and
   a second component configured to receive a second completion signal from a next stage datapath element.

3. The apparatus according to claim 2, wherein the current stage control element further comprises:

a third component configured to receive a second request signal from a previous stage control element.

4. The apparatus according to claim 3, wherein the current stage control element further comprises:

a fourth component configured to receive a third request signal from a next stage control element.

5. The apparatus according to claim 1, wherein the current stage control element further comprises:

a third component configured to receive a second request signal from a next stage control element.

6. The apparatus according to claim 1, wherein the current stage control element comprises:

a first component configured to receive the first completion signal; and a second component configured to receive a second request signal from a previous stage control element.

7. The apparatus according to claim 6, wherein the current stage control element further comprises:

a third component configured to receive a third request signal from a next stage control element.

8. The apparatus according to claim 1, wherein the current stage control element comprises:

a first component configured to receive the first completion signal; and a second component configured to receive a second request from a next stage control element.

9. The apparatus according to claim 1, wherein the current stage datapath element precharges in response to the first request signal.

10. Apparatus for implementing asynchronous circuitry, comprising:

a current stage datapath element configured to respond to a first request signal and process at least one signal; and a current stage control element configured to develop the first request signal based on a second request signal from a previous stage control element, wherein the current stage datapath element and the current stage control element are in the same stage.

11. The apparatus according to claim 10, wherein the current stage control element comprises:

a first component configured to receive the second request signal; and a second component configured to receive a first completion signal from a next stage datapath element.

12. The apparatus according to claim 11, wherein the current stage control element further comprises:

a third component configured to receive a second completion signal from the current stage datapath element.

13. The apparatus according to claim 12, wherein the current stage control element further comprises:

a fourth component configured to receive a third request signal from a next stage control element.

14. The apparatus according to claim 11, wherein the current stage control element further comprises:

a third component configured to receive a third request signal from a next stage control element.

15. The apparatus according to claim 10, wherein the current stage control element comprises:

a first component configured to receive the second request signal; and a second component configured to receive a first completion signal from the current stage datapath element.

16. The apparatus according to claim 15, wherein the current stage control element further comprises:

a third component configured to receive a third request signal from a next stage control element.

17. The apparatus according to claim 10, wherein the current stage control element comprises:

a first component configured to receive the second request signal; and a second component configured to receive a third request signal from a next stage control element.

18. The apparatus according to claim 10, wherein the current stage datapath element precharges in response to the first request signal.

19. Apparatus for controlling a domino circuit, comprising:

a first component for receiving a request signal from a previous stage control element;

a second component for receiving the request signal from the previous stage control element;

a third component for receiving a completion signal from a next stage datapath element;

a fourth component for receiving a request signal from a next stage control element;

a fifth component for receiving a completion signal from a current stage datapath element; and a current stage request component coupled to the first, second, third, fourth and fifth components for developing a current stage request signal.

20. The apparatus according to claim 19, wherein the fourth component comprises:

a first part for reversing the state of the request signal from the next stage control element; and a second part for receiving the reversed request signal.

21. The apparatus according to claim 19, wherein the current stage request component comprises:

an inverter for reversing the state of a signal to form the current stage request signal.

22. The apparatus according to claim 19, wherein the current stage request component comprises:

a wire for forming the current stage request signal.

23. The apparatus according to claim 19, wherein the second and third components each comprise:

a PFET circuit.

24. The apparatus according to claim 19, wherein the first, fourth and fifth components each comprise:

an NFET circuit.

25. A method for controlling a domino circuit, comprising:

receiving a request signal from a previous stage control element;

receiving a completion signal from a next stage datapath element;

receiving a request signal from a next stage control element;

receiving a completion signal from a current stage datapath element; and developing a current stage request signal based on the received signals and transferring the current stage request signal to the current stage datapath circuit.

26. The method according to claim 25, wherein the step of receiving a request signal from a next stage control element includes the steps of:

reversing the state of the request signal from the next stage control element; and receiving the reversed request signal.

27. The method according to claim 25, wherein the step of developing a current stage request signal includes the step of:
reversing the state of a signal to form the current stage request signal.

28. A method for implementing asynchronous circuitry, comprising:
responding to a first request signal and producing a first completion signal upon completion of processing at least one signal; and
developing the first request signal in a current stage control element based on the first completion signal, wherein the step of developing includes the steps of:
receiving the first completion signal;
receiving a second completion signal from a next stage datapath element;
receiving a second request signal from a previous stage control element; and
receiving a third request signal from a next stage control element.

29. A method for implementing asynchronous circuitry, comprising:
responding to a first request signal and producing a first completion signal upon completion of processing at least one signal; and
developing the first request signal in a current stage control element based on the first completion signal, wherein the step of developing includes the steps of:
receiving the first completion signal;
receiving a second completion signal from a next stage datapath element; and
receiving a second request signal from a next stage control element.

30. A method for implementing asynchronous circuitry, comprising:
responding to a first request signal and producing a first completion signal upon completion of processing at least one signal; and
developing the first request signal in a current stage control element based on the first completion signal, wherein the step of developing includes the steps of:
receiving the first completion signal;
receiving a second request signal from a previous stage control element; and
receiving a third request signal from a next stage control element.

31. A method for implementing asynchronous circuitry, comprising:
responding to a first request signal and producing a first completion signal upon completion of processing at least one signal; and
developing the first request signal in a current stage control element based on the first completion signal, wherein the step of developing includes the steps of:
receiving the first completion signal; and
receiving a second request from a next stage control element.

32. A method for implementing asynchronous circuitry, comprising:
responding to a first request signal and producing a first completion signal upon completion of processing at least one signal;
developing the first request signal in a current stage control element based on the first completion signal; and
precharging the current stage datapath element in response to the first request signal.

33. A method for implementing asynchronous circuitry, comprising:
responding to a first request signal and processing at least one signal in a current stage datapath element; and
developing the first request signal in a current stage control element based on a second request signal from a previous stage control element, wherein the step of developing includes the steps of:
receiving the second request signal;
receiving a first completion signal from a next stage datapath element; and
receiving a third request signal from a next stage control element.

34. A method for implementing asynchronous circuitry, comprising:
responding to a first request signal and processing at least one signal in a current stage datapath element; and
developing the first request signal in a current stage control element based on a second request signal from a previous stage control element, wherein the step of developing includes the steps of:
receiving the second request signal;
receiving a third request signal from a next stage control element; and
receiving a first completion signal from the current stage datapath element.

35. A method for implementing asynchronous circuitry, comprising:
responding to a first request signal and processing at least one signal in a current stage datapath element; and
developing the first request signal in a current stage control element based on a second request signal from a previous stage control element, wherein the step of developing includes the steps of:
receiving the second request signal; and
receiving a third request signal from a next stage control element.

36. A method for implementing asynchronous circuitry, comprising:
responding to a first request signal and processing at least one signal in a current stage datapath element;
developing the first request signal in a current stage control element based on a second request signal from a previous stage control element; and
precharging the current stage datapath element in response to the first request signal.

* * * * *